United States Patent [19]

Roger

[11] 4,360,822
[45] Nov. 23, 1982

[54] SEMICONDUCTOR DEVICE HAVING AN IMPROVED SEMICONDUCTOR RESISTOR

[75] Inventor: Bernard P. Roger, Carpiquet, France

[73] Assignee: U.S. Philips Corporation, New York, N.Y.

[21] Appl. No.: 120,414

[22] Filed: Feb. 11, 1980

[30] Foreign Application Priority Data

Feb. 14, 1979 [FR] France .................. 79 03759

[51] Int. Cl.³ .............. H01L 27/04; H01L 29/06; H01C 7/00
[52] U.S. Cl. ........................ 357/46; 357/51; 357/55; 357/56
[58] Field of Search .......... 357/46, 51, 55, 56, 357/89

[56] References Cited

U.S. PATENT DOCUMENTS

| 3,624,454 | 11/1971 | Adkinson | 357/46 |
| 3,659,160 | 4/1972 | Sloan, Jr. et al. | 357/51 |
| 4,011,580 | 3/1977 | Kasperkovitz | 357/51 |
| 4,100,565 | 7/1978 | Khajczadeh et al. | 357/46 |
| 4,118,728 | 10/1978 | Berry | 357/51 |
| 4,151,541 | 4/1979 | Roger | 357/89 |
| 4,288,807 | 9/1981 | Enzlin et al. | 357/56 |

FOREIGN PATENT DOCUMENTS 2335957 7/1977 France .

*Primary Examiner*—William D. Larkins
*Attorney, Agent, or Firm*—Thomas A. Briody; Robert T. Mayer; Steven R. Biren

[57] ABSTRACT

A semiconductor device such as an integrated Darlington circuit includes a mesa which is bounded by two parallel grooves which extend into the device substrate. A semiconductor resistor is formed in the mesa and extends from the mesa surface down to a buried epitaxial layer. This semiconductor resistor is separated from the grooves by a region of semiconductor material, so that its resistance may be established in an accurate and reproducible manner.

7 Claims, 4 Drawing Figures

SEMICONDUCTOR DEVICE HAVING AN IMPROVED SEMICONDUCTOR RESISTOR

BACKGROUND OF THE INVENTION

The invention relates to a semiconductor device having a semiconductor body with a substantially flat surface, comprising a substrate region of a first conductivity type, a first epitaxial layer of the second, opposite conductivity type on said substrate region and a second epitaxial layer of the first conductivity type on said first epitaxial layer, which device comprises a semiconductor resistor having a strip-shaped resistance zone of the second conductivity type extending from the surface into the first epitaxial layer and having a higher doping concentration than the first epitaxial layer, which resistance zone is situated between two parallel grooves extending from the surface into the substrate region, and a surface-adjoining strip-shaped surface zone of the first conductivity type which is provided in said resistance zone and which within the semiconductor body is surrounded entirely by the resistance zone.

A semiconductor device having a semiconductor resistor of the kind described is known from published French Patent Application No. 2,335,957 of R.T.C. Compelec, priority date Dec. 17, 1975. Said application describes an integrated Darlington circuit in which the said semiconductor resistance connects the base zones of the input transistor and the output transistor. This resistor is provided in a zig-zag shape; it is to be noted that the said parallel grooves are to be considered as parallel when their shortest distance is substantially equal everywhere. However, they need not extend as straight lines.

It has proved difficult to give this resistor an accurately determined and reproducible value, which, however is strictly necessary, notably in such integrated circuits as Darlington circuits.

The cause of this difficulty resides in the fact that the resistor on either side of the surface zone of the first conductivity type comprises a part of the resistance zone adjoining the wall of the groove and its cross-section is hard to determine with the required precision. In fact, this depends on the precision with which the grooves can be etched. This in contrast with the dopings, the depths and the extent of the various semiconductor regions which further determine the resistance and which can be controlled with considerable precision.

For example, in a practical case the groove width on the top side is 80 $\mu$m to 100 $\mu$m, said width showing variations of 5 $\mu$m to 20 $\mu$m as a result of deviations in the etching process, the tolerance of the etching mask (at least 5 $\mu$m) being also of importance. The parts of the resistance zone extending on either side of the surface zone and which in the practical case described here each have a width of 10 $\mu$m to 15 $\mu$m, may therefore show very large relative differences. In an extreme case, the groove may even touch the said surface zone so that at least one of the lateral parts of the resistance zone disappears. The said deviations in the cross-section of the lateral parts of the resistance zone may lead to unacceptable deviations in the value of the semiconductor resistance.

SUMMARY OF THE INVENTION

One of the objects of the invention is to provide a different structure of the semiconductor resistance described so that the resistor can be manufactured with great precision and in a reproducible manner.

A semiconductor device of the kind mentioned above is therefore characterized according to the invention in that the resistance zone is separated laterally from the grooves by a region of the first conductivity type.

Since the groove according to the invention is not provided in the resistance zone but in the material of the region of the first conductivity type, the part of the resistance zone situated on either side of the surface zone of the first conductivity type no longer adjoins the walls of the grooves and can hence no longer be influenced by the etching process. As a result of this the above-mentioned lateral parts of the resistor, and hence the whole resistor, can be manufactured with great accuracy and reproducibility.

Moreover, the danger no longer exists that the surface zone of the first conductivity type is exposed at the edge of the grooves by the etching process. As a result of this the depletion zone of the p-n junction between the resistance zone and the adjoining semiconductor material cannot reach the groove so that surface breakdown is avoided. The comparatively high doping concentration of the resistance zone forms a barrier against expansion of the said depletion zone. The depletion zone could expand in the said region of the first conductivity type between the grooves and the resistance zone, but this is no drawback if the region is kept at a floating potential.

The region of the first conductivity type is advantageously formed by a part of the second epitaxial layer and preferably extends along substantially the whole length of the semiconductor resistor so that optimum accuracy and reproducibility is achieved. Furthermore, the surface zone of the first conductivity type also extends preferably over substantially the whole length of the resistor so that high resistance values can be achieved.

The surface zone of the first conductivity type can be kept at a floating potential or can be connected to another element of the device.

The invention is of particular interest in a Darlington circuit in which the first epitaxial layer comprises the base zones of the input transistor and of the output transistor and the second epitaxial layer forms part of the emitter zones of said transistors, the said resistor connecting the base zones. The surface zone of the first conductivity type may advantageously be connected electrically to a highly doped part of the emitter zone of the input transistor via the second epitaxial layer.

Furthermore, a conductor which at the surface connects the emitter zone of the input transistor of the Darlington circuit to the base zone of the output transistor can advantageously adjoin the surface zone of the first conductivity type. This conductor, as will be explained hereinafter, may thus become located substantially entirely on a flat surface so that fracture as a result of develeling is avoided.

BRIEF DESCRIPTION OF THE DRAWINGS

The invention will now be described in greater detail, by way of example, with reference to the accompanying drawing, in which.

Figure 3:
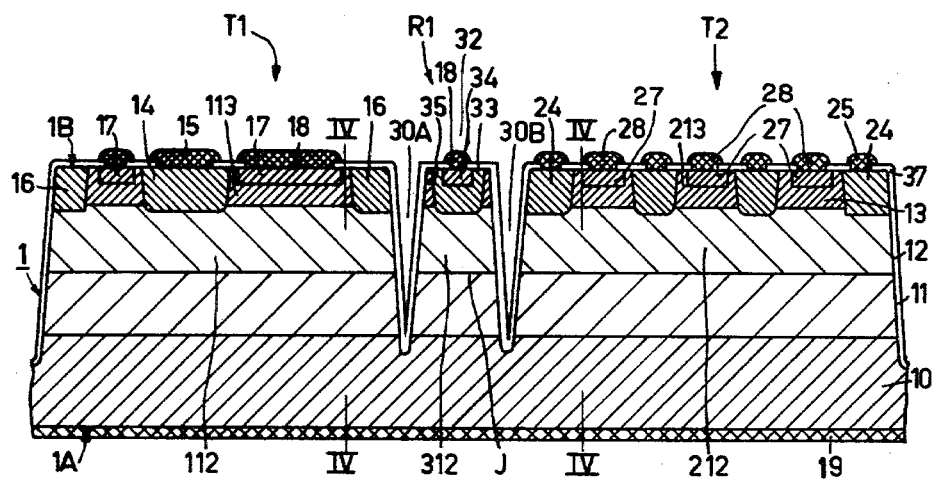
FIG. 3 is a sectional view taken on the line III—III of FIG. 3.
Figure 4:
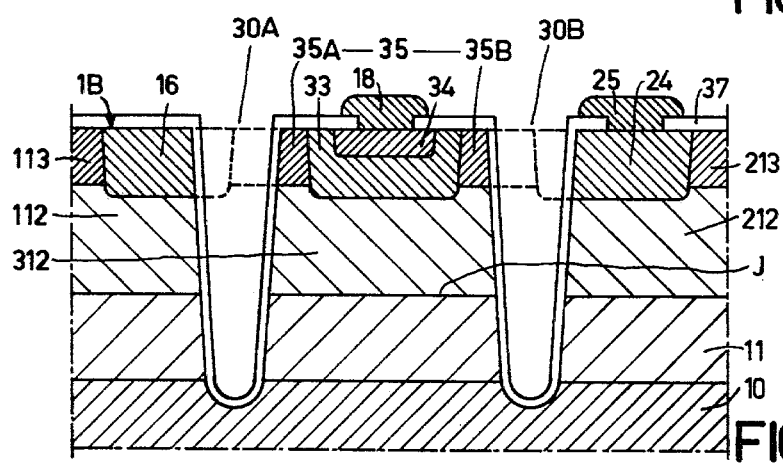
FIG. 4 shows on a larger scale a part of FIG. 3, namely the part between the vertical lines IV—IV.
Figure 2:
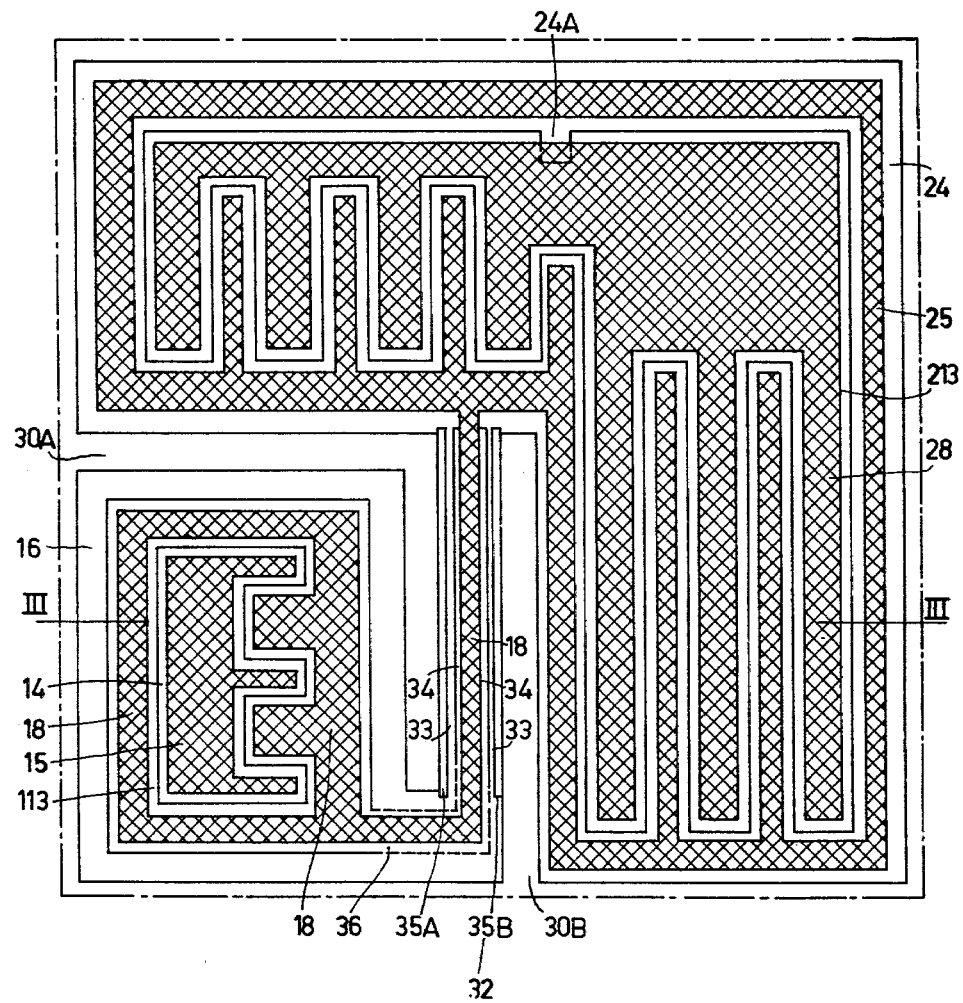
FIG. 2 is a plan view of an embodiment of an integrated Darlington amplifier in which the resistor between the base electrodes of the two transistors is structured according to the invention.

It is to be noted that in FIGS. 2, 3 and 4 the geometrical proportions between the various elements constituting the amplifier are not to scale. The part comprising the resistor which is present between the base zones of the transistors is actually shown to be wider; this was done to make the figure clearer in the part where the invention is realized.

DETAILED DESCRIPTION

Figure 1:
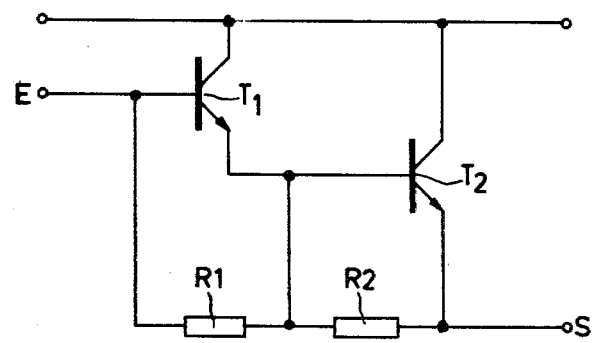
FIG. 1 shows the circuit of a Darlington amplifier.

The Darlington amplifier circuit shown in FIG. 1 comprises an input transistor $T_1$ and an output transistor $T_2$. The figure shows that in known manner the emitter zone of transistor $T_1$ is connected to the base zone of transistor $T_2$, that the collector zones of the two transistors are interconnected, that the base zone of transistor $T_1$ is connected to the input terminal E, while the emitter zone of transistor $T_2$ is connected to the output terminal S of the amplifier. A first resistor $R_1$ is connected in parallel with the emitter-base junction of transistor $T_1$; it is the configuration of resistor $R_1$ which forms the subject matter of the present invention. A second resistor $R_2$ is connected in parallel with the emitter-base junction of transistor $T_2$. In the present case the two transistors $T_1$ and $T_2$ are of the npn type.

The amplifier shown in FIGS. 2 and 3 which comprises an input transistor $T_1$ and an output transistor $T_2$ is manufactured in a semiconductor body 1; according to the thickness of the said body 1 and viewed from the lower surface 1A to the upper surface 1B, the body 1 comprises first of all a highly doped substrate 10 of a first conductivity type on which an epitaxial substrate region 11 is present which is also of the first conductivity type but is lower doped than the substrate 10. Provided on the substrate region 11 is a comparatively low doped first epitaxial layer 12 of the second conductivity type on which a likewise comparatively low-doped second epitaxial layer 13 of the first conductivity type is provided.

The regions 10 and 11 constitute the common collector zone of the two transistors.

Grooves 30A and 30B which are provided from the upper surface 1B and extend into the substrate region, namely into the highly doped region 10, serve to separate certain parts of the layers 12 and 13; parts 112 and 212 of the layer 12 constitute the respective base zone of the transistors $T_1$ and $T_2$, and parts 113 and 213 of the layer 13 constitute parts of the respective emitter zones of said transistors $T_1$ and $T_2$.

The base zones are connected to surface conductors via highly doped connection zones of the second conductivity type; the zone 14 connects the base zone 112 to the conductor 15, while the zone 24 connects the base zone 212 to the conductor 25.

Furthermore, a surface conductor 18 is provided on a highly doped surface zone 17 which is formed in the emitter zone 113 of transistor $T_1$; a surface conductor 28 is also provided on a highly doped surface zone 27 which is formed in the emitter zone 213 of transistor $T_2$.

As shown in the plan view of FIG. 2, the connection zone 14 of the base zone 112 of transistor $T_1$ is fully surrounded by the emitter zone 113 of the said transistor, the said emitter zone 113 being partly surrounded by the connection zone 16 adjoining the groove 30A. On the other hand, the connection zone 24 of the base zone 212 of transistor $T_2$ fully surrounds the emitter zone 213 of said transistor.

The grooves 30A and 30B are parallel over a part of their length. In this part a mesa 32 is formed between the said grooves. The resistor $R_1$ of the diagram shown in FIG. 1 is formed in the said mesa.

The resistor $R_1$ is formed on the one hand by the part 312 of the epitaxial layer connecting the base zones 112 and 212 and on the other hand by a resistance zone 33 which is connected parallel to the said part 312. This resistance zone is formed by a region 33 of the second conductivity type which extends from the upper surface 1B into the first epitaxial layer 12 where the resistance zone 33 adjoins the epitaxial layer portion 312. The resistance zone 33 constitutes an ohmic resistance between the connection zone 16 of transistor $T_1$ and the connection zone 24 of transistor $T_2$.

The resistance zone 33 surrounds a surface zone 34 of the first conductivity type which adjoins the upper surface 1B.

According to the invention, the resistance zone 33 is separated laterally from the grooves 30A and 30B by a region 35 of the first conductivity type.

Practically the said region 35 is divided into two sub-regions 35A and 35B, each sub-region adjoining the resistance zone 33 laterally.

The region 35 divided into its two sub-regions 35A and 35B itself forms a part of the second epitaxial layer 13. The said region 35 is the remainder of a region consisting of the layer 13 and of the adjacent zones 16 and 24 through which the grooves 30A and 30B are provided (see FIG. 4 where the broken lines denote the boundaries of the zones 16, 24 and of the region 35 prior to providing the grooves) and the width of which is chosen to be of such size that the said grooves do not remove any material of the resistance zone 33. In practice, a distance of approximately 60 $\mu$m on the upper surface 1B is maintained between the edge of the resistance zone 33 and the edge of the etching mask (20 $\mu$m for normal undercutting, 20 $\mu$m as regards the maximum tolerance of the etching process, 5 $\mu$m tolerance for the positioning of the mask and another 15 $\mu$m width for the sub-regions 35A and 35B, respectively).

In the above-mentioned structure known from French Patent Application No. 2,335,957, the resistance zone 33 directly adjoins the grooves 30A and 30B. The width of the parts of the zone 33 situated on either side of the surface zone 34 directly depends on the width of the grooves and of the position thereof. It will be obvious that in these circumstances the ohmic value of the resistor R1 is inaccurate and poorly reproducible.

With respect to the structure according to the invention, in the case in which the depletion zone of the junction J (situated in the mesa 32 at the interface between the region 11 and the layer 12) would extend in the direction of the surface 1B beyond the said layer 12, the said depletion zone on one side will reach the region 33 and on the other side the region 35. The potential of the said region 35 which is kept "floating" would thus be changed but breakdown would not occur.

Although it is possible to divide the surface zone 34 and the sub-regions 35A and 35B into several parts, this is preferably not done, and both the zone 34 and the regions 35A and 35B are provided substantially throughout the length of the mesa 32.

The zone 34 may be insulated both structurally and electrically. In the plan view of FIG. 2 which corresponds to a preferred embodiment of the invention, the surface zone 34 is directly connected to the surface zone 17 (below the conductor 18) which is formed in the emitter zone 113 of transistor $T_1$, via a strip-shaped semiconductor zone 36 of the first conductivity type. In FIG. 2 the strip 36 is bounded by broken lines so as to distinguish clearly between the three connected parts, namely; the zone 17, the strip 36 and the zone 34. The surface conductor 18 is in direct contact with the strip 36 and with the zone 34; the conductor 18 thus is flat throughout its surface and is present in the same plane as the conductor 25 of the base zone of transistor $T_2$.

Finally (see FIG. 1) the resistor $R_2$ is formed, as shown in FIG. 2, by an elongation 24A of the zone 24 in the direction of the zone 27 (below the conductor 28) on which elongation a contact is realized by means of the said conductor 28 of the emitter zone of transistor T2.

The device according to the invention can be manufactured by using methods generally known in semiconductor technology. For example, the amplifier described with reference to FIGS. 2, 3 and 4 with npn transistors) can be manufactured by means of the following process steps (starting from a semiconductor plate of $n^{30}$ conductive silicon):

Providing epitaxially the n-conductive region 11 (thickness 20 μm respectively $\rho \approx 10$ ohm.cm)

Providing epitaxially the P-conductive layer 12 (thickness 10 μm $\rho \approx 6$ ohm.cm)

Providing epitaxially the N conductive layer 13 (thickness 5 μm $\rho \approx 3$ ohm.cm)

Diffusing the P conductive zones 14, 16, 24 and of the p conductive resistance zone 33 (thickness 6.5 μm, sheet resistance ($R_\square \approx 100$ Ohm per square)

Diffusing the $N^{30}$ conductive zone 17, 27 and of the N+ conductive zone 34 (thickness 2.5 μm to 3 μm, $R_\square = 2$ ohm per square);

etching the grooves 30A and 30B (depth approximately 40 μm, width at the surface: 80 μm to 100 μm);

passivating by providing an oxide film 37 on the surface 1B and in the grooves:

providing the contact windows, and metallization and photoetching of the metal layer to realize the connections. In particular: providing a metallization 19 on the lower surface 1A for realizing the connections to the collector zones of the transistors $T_1$ and $T_2$.

The width of the mesa 32 is 130 μm to 150 μm. The width of the surface zone 34 is 80 μm to 90 μm. The width of the sub-regions 35A and 35B is not important since these sub-regions do not fulfil an electric functions; in practice the said width is from 10 μm, to 15 μm.

The above-mentioned numerical values would be approximately the same in the case of an amplifier formed by pnp transistors.

What is claimed is:

1. A semiconductor device having a semiconductor body with a substantially flat surface, a substrate region of a first conductivity type, a first epitaxial layer of the second, opposite, conductivity type on said substrate region and a second epitaxial layer of the first conductivity type on said first epitaxial layer, said device comprising a semiconductor resistor having a strip-shaped resistance zone of the second conductivity type, extending from the surface into the first epitaxial layer and having a higher doping concentration than that of the first epitaxial layer, said resistance zone being situated between two parallel grooves extending from the surface into the substrate region, and a surface-adjoining strip-shaped surface zone of the first conductivity type which is provided in said resistance zone and which is surrounded entirely by the resistance zone within the semiconductor body, the resistance zone being separated laterally from the grooves by a region of the first conductivity type.

2. A semiconductor device as claimed in claim 1, wherein the region of the first conductivity type is formed by a part of the second epitaxial layer.

3. A semiconductor device as claimed in claim 1 or 2, wherein the region of the first conductivity type extends along substantially the whole length of the semiconductor resistor.

4. A semiconductor device as claimed in claim 1 or 2 wherein the surface zone of the first conductivity type extends over substantially the whole length of the semiconductor resistor.

5. A semiconductor device as claimed in claim 1 or 2, wherein the device comprises a Darlington circuit in which the first epitaxial layer comprises the base zones of the input transistor and of the output transistor, and the second epitaxial layer forms part of the emitter zones of said transistors, the said resistor connecting the base zones.

6. A semiconductor device as claimed in claim 5, wherein the surface zone of the first conductivity type is connected to a highly doped part of the emitter zone of the input transistor via the second epitaxial layer.

7. A semiconductor device as claimed in claim 5 wherein a conductor which at the surface connects the emitter zone of the input transistor to the base zone of the output transistor adjoins the surface zone of the first conductivity type.

* * * * *